(12) United States Patent
Ueda et al.

(10) Patent No.: US 7,208,868 B2
(45) Date of Patent: *Apr. 24, 2007

(54) LIGHT-EMITTING DEVICE AND ITS USE

(75) Inventors: Naoyuki Ueda, Kanagawa (JP);
Yasunori Kuima, Tokyo (JP);
Shinichiro Tamura, Kanagawa (JP)

(73) Assignee: Sony Corporation, Tokyo (JP)

(*) Notice: Subject to any disclaimer, the term of this patent is extended or adjusted under 35 U.S.C. 154(b) by 93 days.

This patent is subject to a terminal disclaimer.

(21) Appl. No.: 10/779,005

(22) Filed: Feb. 13, 2004

(65) Prior Publication Data

US 2004/0217690 A1    Nov. 4, 2004

Related U.S. Application Data

(63) Continuation-in-part of application No. 09/808,317, filed on Mar. 14, 2001, now Pat. No. 6,806,641.

(30) Foreign Application Priority Data

Mar. 15, 2000    (JP)    ............................ P2000-071445

(51) Int. Cl.
*H05B 33/26* (2006.01)

(52) U.S. Cl. ...................... 313/503; 313/506; 428/917

(58) Field of Classification Search ........ 313/501–512, 313/309, 336, 351; 428/917
See application file for complete search history.

(56) References Cited

U.S. PATENT DOCUMENTS

| | | | | |
|---|---|---|---|---|
| 5,977,704 A | * | 11/1999 | Shi et al. ..................... | 313/504 |
| 5,989,737 A | * | 11/1999 | Xie et al. .................... | 428/690 |
| 6,296,954 B1 | * | 10/2001 | Arai et al. ................... | 428/690 |
| 6,468,676 B1 | * | 10/2002 | Ueda et al. .................. | 428/690 |

FOREIGN PATENT DOCUMENTS

| | | |
|---|---|---|
| EP | 0805143 | 11/1997 |
| EP | 0845925 | 6/1998 |
| EP | 0880304 | 11/1998 |
| EP | 0994517 | 4/2000 |
| WO | 9747050 | 12/1997 |

* cited by examiner

*Primary Examiner*—Ashok Patel
(74) *Attorney, Agent, or Firm*—Sonnenschein Nath & Rosenthal LLP

(57) ABSTRACT

A light-emitting device comprises a layer including an emission region and provided between an anode and a cathode wherein the anode has a visible light (with a wavelength of 380 to 780 nm) transmittance ranging from 35 to 75%, and the anode has a work function of 3.0 to 7.0 eV whereby the device has an improved contrast characteristic while keeping high luminance.

12 Claims, 7 Drawing Sheets

α-NPD:

Alq₃:

F I G. 5
m- MTDATA :
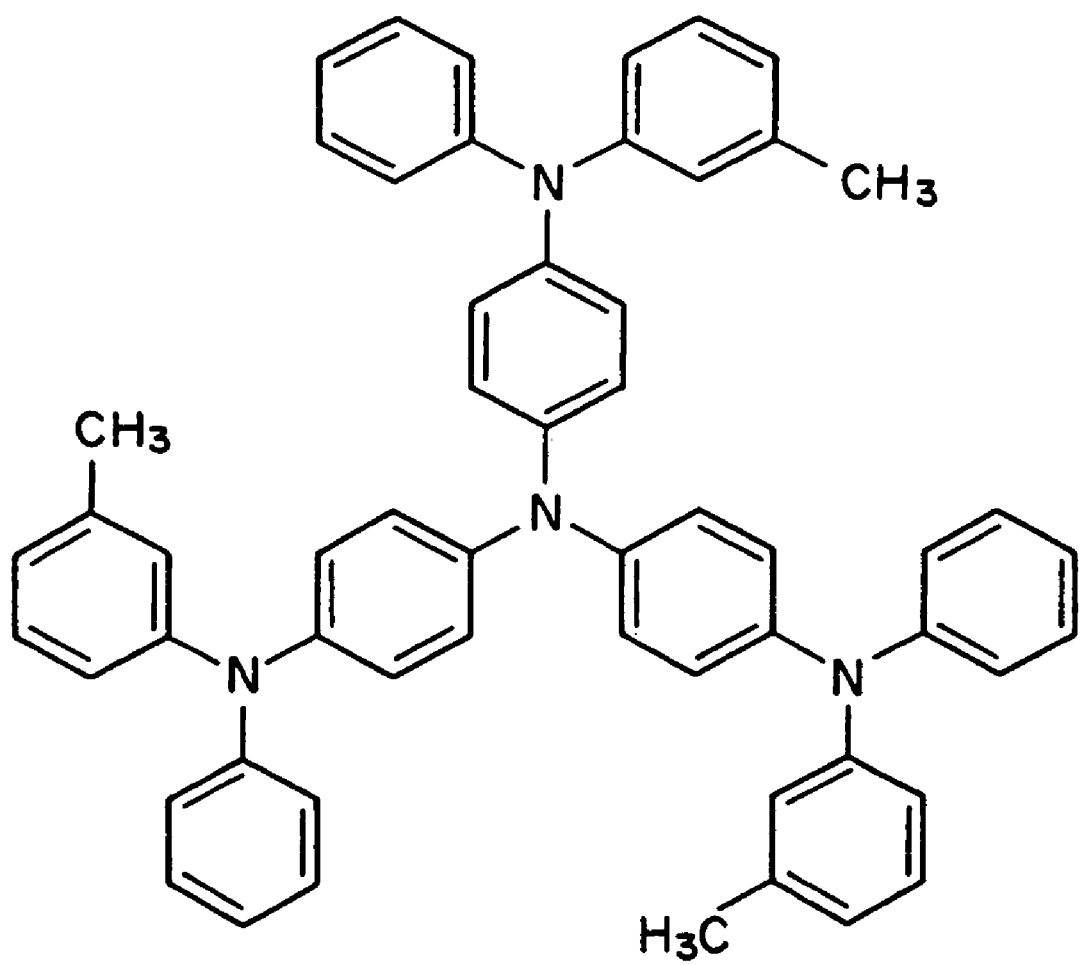

LIGHT-EMITTING DEVICE AND ITS USE

RELATED APPLICATION DATA

The present application claims priority to Japanese Application No. P2000-071445, filed Mar. 15, 2000, and is a continuation-in-part of U.S. application Ser. No. 09/808,317, filed Mar. 14, 2001 now U.S. Pat. No. 6,806,641, all of which are incorporated herein by reference in their entirety to the extent permitted by law.

BACKGROUND OF THE INVENTION

This invention relates to a light-emitting device of a spontaneous emission type used, for example, as a display device such as a color display, and also to the use thereof.

In recent years, importance of the interface between the human being and the machine increases, particularly, in multimedia-oriented articles. In order to operate the machine more comfortably and more efficiently, it is necessary to retrieve a satisfactory quantity of information concisely and instantaneously from the machine. To this end, studies have been made on a variety of display devices.

As the scale-down of machines is in progress, there is an increasing demand, day by day, for the display device with respect to its scale-down and thinning. Specific examples of main display devices are described below.

A liquid crystal display that is one of typical display devices is now used as an interface of a variety of articles, and has been widely employed in lap top-type information processing machines and also in living articles including small-sized television sets, watches, desk-top calculators and the like.

While making use of the feature that a liquid crystal is driven at a low voltage with a reduced power consumption, the liquid crystal display has been studied solely as an interface, which is a key of devices including from small-sized to large capacitance display devices.

However, the liquid crystal display is of the light-receiving type, for which back light is essential. For the drive of the back light, it is necessary to provide electric power that is greater than that for a liquid crystal. Accordingly, although a battery is built in, limitation is placed on power supply, with the attendant problem that the working time becomes shortened, thus imposing a limit on its use.

Moreover, with respect to the liquid crystal displays, inherent problems can be indicated.

Initially, because of its narrow angle of field, the liquid crystal display is not suited for a large-sized display. Additionally, the liquid crystal display is one wherein display is realized owing to the oriented state of liquid crystal molecules, with the problem that the contrast may change depending on the angle even within a range of its angle of field.

On the other hand, in view of a drive system, the active matrix system of a liquid crystal display exhibits a response speed sufficient to deal with a motion picture. Nevertheless, since a TFT drive circuit is used, it is difficult to scale up a picture size by the influence of pixel defects. In addition, the active matrix system is not beneficial from the standpoint of cost saving.

The simple matrix system, which is another type of drive system, is low in cost unlike the above case and is relatively easy in scaling-up of a picture size, but has the problem that its response speed is not sufficient to cope with a motion picture.

In contrast to such liquid crystal devices as set out above, plasma display devices, inorganic electroluminescent devices, organic electroluminescent devices and the like, which are described hereinbelow, are those devices belonging to the spontaneous emission type.

The plasma display device makes use, for display, of plasma emission in a low pressure gas, and is suited for scaling-up and realization of large capacitance. However, this device has the problem on thinning and costs. In addition, an AC bias of high voltage is necessary for its drive, and thus, the plasma display device is not suitable for use as a portable device.

As for the inorganic electroluminescent device, a green light emission display has been put on the market, and necessitates several hundreds of voltages for AC bias drive like the plasma display device, thus being not accepted by users.

In fact, as a result of further technical developments, emissions of three primaries of RGB, which are necessary for a color display, are now in success. Because inorganic materials are essential for device arrangement, it is not possible to control an emission wavelength such as by a molecular design. In view of this, it is presumed to involve difficulties for realizing a full color display.

The organic electroluminescent device utilizes electroluminescence based on organic compounds, and this phenomenon was discovered about 30 and several years ago. More particularly, in the first half of 1960's, it was observed that when carriers are injected into an anthracene single crystal capable of intensely emitting fluorescence, a unique light-emitting phenomenon (induced by luminescence) occurs. Since then, although an organic electroluminescent device has been studied over a long time, a technical emphasis has been placed mainly on the carrier injection into an organic material because of its low luminance and monochrome and also of the use of a single crystal, and thus, its study has been within a range of a fundamental stage.

Around the time passing the middle of 1980's, circumstances have changed. In 1987, Tang et al. of Eastman Kodak released an organic thin film electroluminescent device that was epoch-making at that time. This is composed of a built-up structure having an amorphous emission layer and enables low voltage drive and emission of high luminance. With the disclosure of this built-up structure as a start, studies and developments of an organic luminescent device were further encouraged. As a consequence, studies have been extensively made, up to now, on the emission of three primaries of RGB, stability, rise of luminance, built-up structure and manufacturing method.

Besides, novel materials for displays have been successively developed while making use of the molecular design that is possible only for organic materials. Thus, organic electroluminescent devices have appeared in succession as having good features such as of DC low voltage drive, thinning, spontaneous emission property and the like. Its applications to a color display has been extensively studied.

The merits and demerits of the typical display devices have been hereinabove set forth along with the history of developments. Because the invention is directed to improvements in organic and inorganic electroluminescent devices among these display devices, the problems that are now involved in electroluminescent devices and are required, by many fields of industry, to be overcome are described below.

The contrast characteristic is one of main properties of a display. With spontaneous emission-type display devices such as an organic electroluminescent device, an inorganic electroluminescent device and the like, a satisfactory contrast cannot be obtained by the influence of a metal back (i.e., reflection of external light with a metal cathode). Especially, the contrast of an organic electroluminescent device is, at most, as small as approximately 200:1. Thus, there is a demand, from many fields of industries, for the development of a display device having a contrast sufficient to exceed the above-mentioned contrast.

The luminous efficiency of the organic electroluminescent device is still unsatisfactory. Mention is made, as one of the reasons for this, of the fact that an injection efficiency of carriers from an electrode into an organic layer is small.

Further, a great obstacle involved in the development of an organic electroluminescent device is that an anode material is limited almost to ITO, ZnO, $SnO_2$ and related substances, thus placing a great limitation on the energy matching of a hole injection material with the anode material.

SUMAMRY OF THE INVENTION

It is accordingly an object of the invention to provide a light-emitting device including an organic electroluminescent device, an inorganic electroluminescent device or the like, which overcomes the problems or disadvantages of the prior art counterparts.

It is another object of the invention to provide a light-emitting device, which has an improved contrast while keeping high luminance.

The above objects can be achieved, according to the invention, by a light-emitting device which comprises an anode and a cathode, and a layer including a light-emitting region and provided between the anode and the cathode wherein the anode has a visible light transmittance of 35 to 75%.

It will be noted that the term "layer containing the light-emitting region" is intended to mean a layer arrangement including an organic compound layer and/or an inorganic compound layer having such a function as described hereinafter. Also, the term "visible light" means an electromagnetic wave usually having a wavelength of 380 to 780 nm.

We have found that when the visible light transmittance of the anode is defined within a range of from 35 to 75%, preferably from 40 to 70%, i.e., when the anode is so arranged as to keep an optically specific state of "semi-transparency", the resultant light-emitting device including not only an organic electroluminescent device, but also an inorganic electroluminescent device enables one to reliably improve a contrast while keeping high luminance. More particularly, if light transmittance of the anode is set within such a range as defined above, a quantity of external light incident on the device and a transmission quantity of reflected light at the metal cathode of the incident light can be both reduced, thus leading to an improvement in contrast. Moreover, choice of an anode material from various materials that can be appropriately matched, in energy level, with a hole injection layer within the above range of light transmittance becomes possible. Accordingly, if the light transmittance lowers, the quantity of carrier injection (i.e., an emission quantity) can be increased while keeping a high luminance. In contrast, if the light transmittance is outside the above range, the above effects are not shown significantly.

Especially, with an organic electroluminescent device, since the light transmittance of the anode is defined within a range of 35 to 70%. The work function of the anode can be arbitrarily defined within a range of 3.0 to 7.0 eV. In this condition, when proper choice of an anode material that ensures energy matching with a hole injection layer (i.e., when the energy matching therebetween is optimized), the injection efficiency of holes can be improved, with an enhanced luminous efficiency.

In addition, the range of the choice of an anode material can be extended in this way, so that limitation on the type of hole injection material can be cleared, thus making it possible to select both materials from wider ranges of materials in comparison with prior-art cases.

BRIEF DESCRIPTION OF THE DRAWINGS

FIG. 5 is a view showing the structural formula of m-MTDATA used in a hole injection layer of the organic electroluminescent device;

DETAILED DESCRIPTION OF THE PREFERRED EMBODIMENTS

Figure 1A:
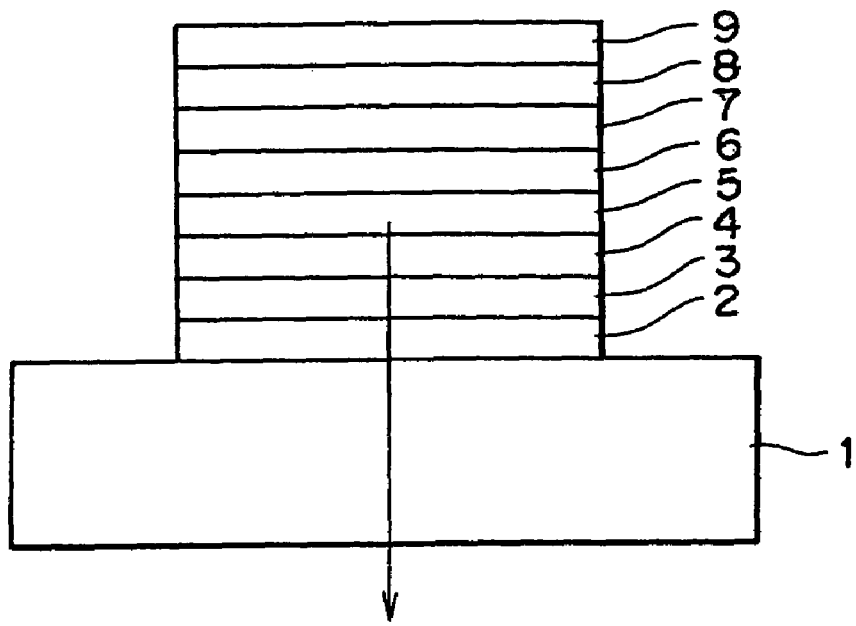
FIGS. 1A and 1B are, respectively, a schematic sectional view showing an arrangement of an organic electroluminescent device according to one embodiment of the invention.

In the practice of the invention, in order to keep a high luminance and improve a contrast, the anode should keep its transmittance at 35 to 75% throughout a visible light region (usually having a wavelength of 380 to 780 nm).

In order to achieve this, it is preferred to use, as an anode material, one or more metals selected from those of groups IIIA, IVA, VA, VIA, VIIA, VIIIA and IB of the periodic table, or one or more compounds thereof.

Specific examples of the metal include Ni, Ru, Ir, Rh, Pt, Pd, Re, Ti, Zr, Nb, Mo, W and the like.

The metal compounds preferably include oxides, nitrides or oxide-nitrides. Specific examples include $LiNiO_2$, $PtRhO_x$, $TiNbO_x$, $WReO_x$, NiO, $RuO_x$, $IrO_x$, $PtO_x$, $RhO_x$, $PdO_x$, $ReO_x$, $WO_x$, NiNO, LiNiNO, RuNO, IrNO, PtNO, RhNO, ReNO, WNO, TiNO, TiN, ZrN and the like.

In order to improve physical and chemical characteristics of the anode, it is convenient to add a dopant to an anode material. Typical examples of a dopant-added anode material include $R_xNiO$, wherein R=H, Li, Na, K, Rb, Cs, Cu, Ag or Au, $R_xWO_3$ wherein R=H, Li, Na, K, Rb, Cs, Cu, Ag or Au, $TiNb_xO_y$ and the like.

It will be noted that the composition of the anode material is not always stoichiometric but may have an indefinite ratio.

The anode material may have a crystal phase which is single or plural in number.

As a matter of course, the morphology of an anode layer is not critical. It is preferred to use a uniform film having high smoothness, e.g., an amorphous film, a finely crystalline film, an epitaxial film, a single crystal film or a similar film thereof.

For increasing a hole injection efficiency, it is preferred that an anode material has a p-type electric conduction characteristic.

The anode may be made of a single layer or plural layers. Especially, where a built-up structure including a transparent electrode such as of ITO is provided, optimization of a composition and a layer thickness can lead to desirable control of the light transmittance, a work function described hereinafter, and electric resistivity without a sacrifice of other characteristics.

As a preferred example of an anode structure with respect to the phase and layer, a phase containing such a metal as mentioned hereinbefore and a metal compound and a phase containing zinc, indium or tin are so arranged as to provide a single-layered or multi-layered structure.

In the practice of the invention, the anode not only meets the requirement for the semi-transparency, but also should preferably have a work function defined within 3.0 to 7.0 eV.

If these requirements are satisfied, the energy matching between the hole injection layer and the anode can be optimized. This not only brings about an improved hole injection efficiency and an enhanced luminous efficiency, but also can solve the problem on the mutual restriction of the hole injection layer and the anode, thus enabling the use of wider ranges of materials for both.

It will be noted that for the manufacture of an anode of a light-emitting device of the invention, any film-forming procedures known in this art may be used including, for example, sputtering, electron beam deposition, ion plating, laser ablation and the like techniques.

As set out hereinabove, for the purpose of increasing a retrieval efficiency of external light, it has been usual to exclusively use, as an anode, a limited material such as ITO, ZnO, $SnO_2$ or a related material thereof so that a so-called "transparent electrode" is made as having a visible light transmittance of 80% or over. Eventually, a hole injection material and an anode material are mutually, strongly restricted with respect to energy matching, and their selections and applications are much limited, respectively. This problem is solved according to the invention wherein the visible light transmittance of the anode is defined within a specific range not used in prior art.

The structural arrangements of the light-emitting device according to preferred embodiments of the invention are described while appropriately referring to the accompanying drawings.

Initially, an actually preferred fundamental structure of the light-emitting device of the invention comprises an anode, an organic or inorganic layer including an emission region, and a cathode superposed successively on a transparent substrate.

The organic layer may have various alterations with respect to its layer arrangement depending on the purpose. For instance, a hole transport layer may be formed at the anode side, and an electron transport layer may be formed at the cathode side.

Moreover, a hole injection layer may be provided between the anode and the hole transport layer.

Likewise, an emission layer may be formed between the hole transport layer and the electron transport layer.

Figure 1B:
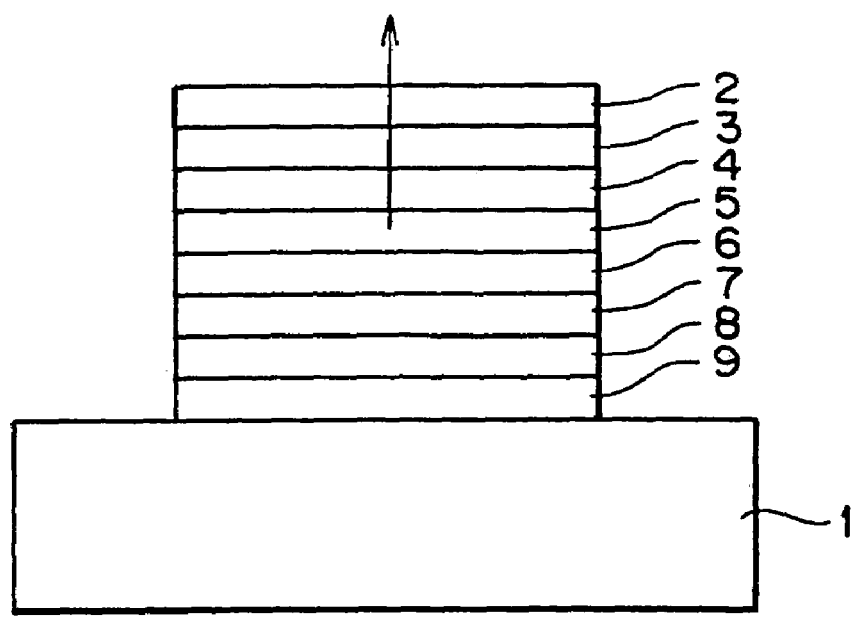

FIGS. 1A and 1B, respectively, show an instance of a light-emitting device of the invention. This device is called organic electroluminescent device. In the figure, there is shown an arrangement including, aside from the above-mentioned layer structure, an additional layer. More particularly, the light-emitting device of FIG. 1A includes, on a transparent substrate 1, an anode 2, a hole injection layer 3, a hole transport layer 4, an emission layer 5, an electron transport layer 6, an electron injection layer 7, a buffer layer 8 and a cathode 9 superposed in this order such as by vacuum deposition.

In contrast, the light-emitting device shown in FIG. 1B has such an arrangement wherein the respective layers are formed on the substrate in an order reverse to those of the light-emitting device of FIG. 1A.

Figure 2:
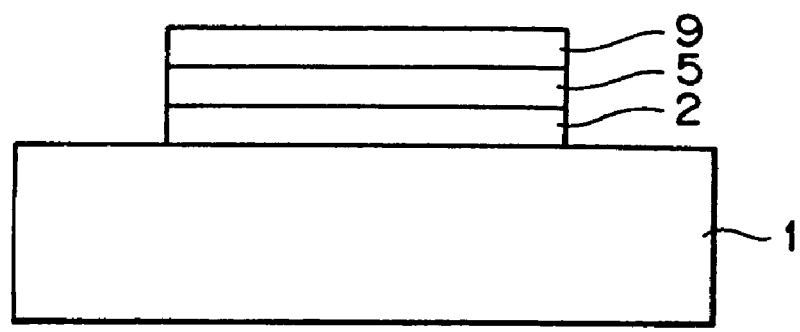
FIG. 2 is a schematic sectional view showing an arrangement of an inorganic electroluminescent device according to another embodiment of the invention.

The light-emitting device of FIG. 2 is a so-called inorganic electroluminescent device including, on a transparent substrate, an anode 2, an emission layer 5 and a cathode 9 superposed in this order.

As for the materials for the hole injection layer, hole transport layer, emission layer, electron transport layer, electron injection layer, buffer layer and cathode, known materials ordinarily used in this art may be used for these purposes without limitation.

Figure 3:
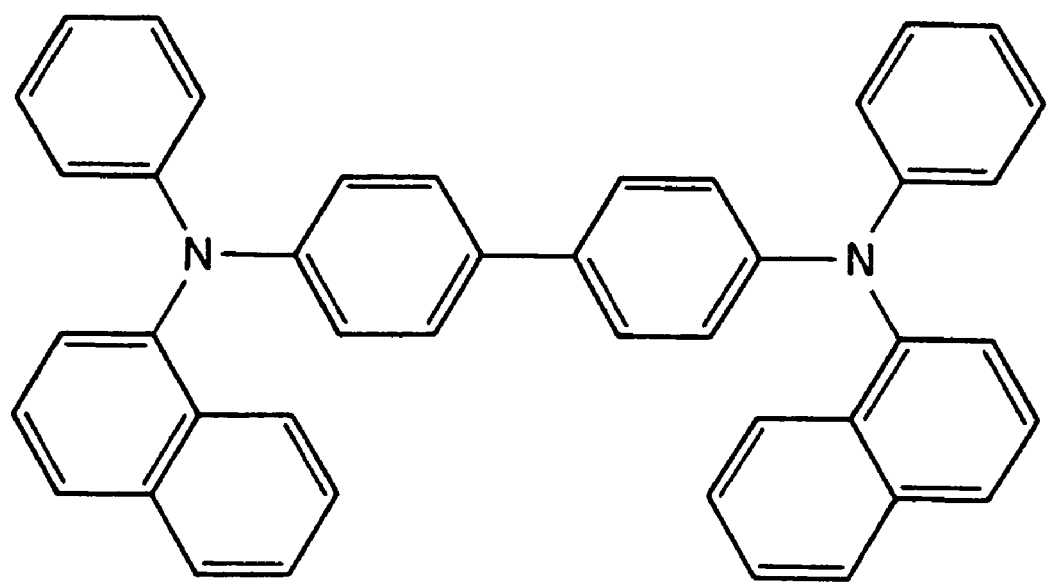
FIG. 3 is a view showing the structural formula of α-NPD used in a hole transport layer of an organic electroluminescent device.

For instance, for the arrangement of the hole transport layer, there may be used benzidine derivatives, styrylamine derivatives, triphenylmethane derivatives, triphenylamine (or arylamine) derivatives, hydrazone derivatives and the like of these, α-NPD (α-naphthylphenyldiamine) shown in FIG. 3 has been frequently used as a hole transport material.

Figure 4:
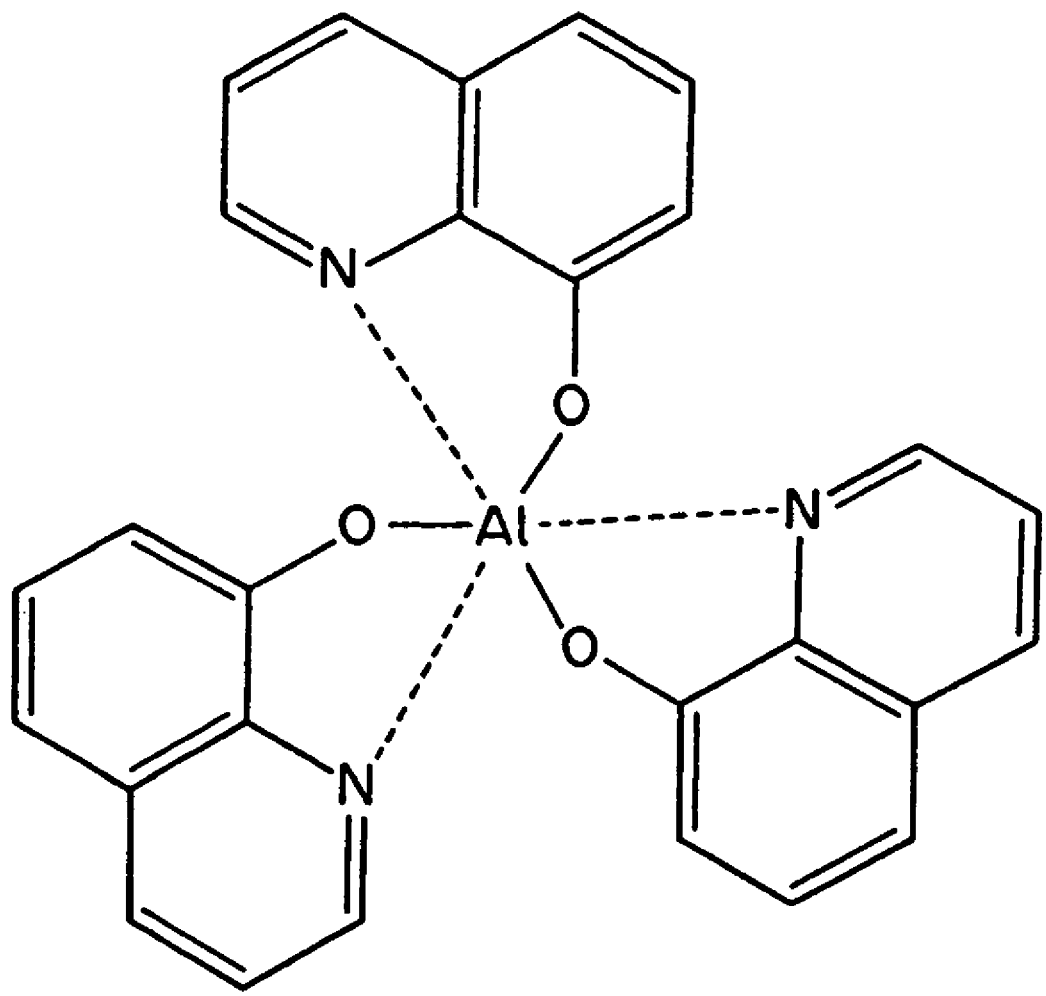
FIG. 4 is a view showing the structural formula of $Alq_3$ used in an electron transport layer of the organic electroluminescent device.

Likewise, for the formation of the electron transport layer, there are used perylene derivatives, bisstyryl derivatives, pyrazine derivatives and the like. More particularly, $Alq_3$ (8-hydroxyquinoline aluminum) shown in FIG. 4 is preferably used as an electron transport material.

For the formation of the hole injection layer, m-MTDATA (4,4',4"-tris(3-methylphenylphenylamino)triphenylamine) shown in FIG. 5 is preferably used as a hole injection material.

In order to control emission spectra of the emission layer, other type of organic material may be co-deposited. To this end, there are used perylene derivatives, coumarin derivatives, benzidine derivatives and the like. Of course, an organic layer containing a pyran derivative may be used.

The cathode material should preferably include a metal, which exhibits a small work function from the vacuum level thereof, so as to efficiently inject electrons into other layer. For example, In, Mg, Ca, Sr, Ba, Li or the like is conveniently used after alloying with other type of metal for imparting better stability thereto.

In order to permit efficient injection of electrons into other layer, the buffer layer may be so arranged that an alkali metal oxide, an alkali metal fluoride, an alkaline earth metal oxide or an alkaline earth metal fluoride, such as $Li_2O$, LiF, SrO, $CaF_2$ or the like is interposed between the layers of a cathode material and an electron injection material.

It will be noted that for the drive of the light-emitting device of the invention, it is desirable that the device be preliminarily, hermetically sealed, for example, with germanium oxide so that the influence such as of oxygen in air is removed to increase the stability and that peripheral spaces be evacuated to vacuum.

The light-emitting device of the invention is beneficially applicable to displays, computers, television receivers, billboards, studio screens, facsimile sets, portable telephones, portable terminals, vehicles, camcorders, cameras, or acoustic devices.

The invention is more particularly described by way of examples.

EXAMPLE 1

ITO (with a film thickness of about 150 nm) and NiO (with a film thickness of about 120 nm) were, respectively, deposited, as an anode, on a 30 mm×30 mm glass substrate by RF sputtering. The light transmittance of this anode was found to be 25% at 520 nm, with its work function being 5.51 eV. A cell for making an organic electroluminescent device, in which an area other than a 2 mm×2 mm emission region was masked through deposition of $SiO_2$, was formed on this built-up body. Next, α-NPD (α-naphthylphenyldiamine) was deposited, as a hole transport layer, in a thickness of 50 nm (at a deposition rate of 0.2 nm/second) under vacuum according to a vacuum deposition technique. $Alq_3$ (8-hydroxyquinoline aluminum) was deposited in a thickness of 50 nm as an electron transporting emission layer, and $Li_2O$ was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 38.7 $mA/cm^2$, and the luminance was at 440 $cd/m^2$. The non-emission luminance under an irradiation of $300 1_x$ was found to be 2.44 $cd/m^2$, with a contrast being 180:1.

EXAMPLE 2

ITO (with a film thickness of about 150 nm) and NiO (with a film thickness of about 100 nm) were, respectively, deposited, as an anode, on a 30 mm×30 mm glass substrate by RF sputtering. The light transmittance of this anode was found to be 30% at 520 nm, with its work function being 5.52 eV. A cell for making an organic electroluminescent device, in which an area other than a 2 mm×2 mm emission region was masked through deposition of $SiO_2$, was formed on this built-up body. Next, α-NPD (α-naphthylphenyldiamine) was deposited, as a hole transport layer, in a thickness of 50 nm (at a deposition rate of 0.2 nm/second) under vacuum according to a vacuum deposition technique. $Alq_3$ (8-hydroxyquinoline aluminum) was subsequently deposited in a thickness of 50 nm as an electron transporting emission layer, and $Li_2O$ was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 38.7 $mA/cm^2$, and the luminance was at 528 $cd/m^2$. The non-emission luminance under an irradiation of $300 1_x$ was found to be 2.45 $cd/m^2$, with a contrast being at 220:1.

EXAMPLE 3

ITO (with a film thickness of about 150 nm) and NiO (with a film thickness of about 80 nm) were, respectively, deposited, as an anode, on a 30 mm×30 mm glass substrate by RF sputtering. The light transmittance of this anode was found to be 35% at 520 nm, with its work function being 5.5 eV. A cell for making an organic electroluminescent device, in which an area other than a 2 mm×2 mm emission region was masked through deposition of $SiO_2$, was formed on this built-up body. Next, α-NPD (α-naphthylphenyldiamine) was deposited, as a hole transport layer, in a thickness of 50 nm (at a deposition rate of 0.2 nm/second) under vacuum according to a vacuum deposition technique. $Alq_3$ (8-hydroxyquinoline aluminum) was subsequently deposited in a thickness of 50 nm as an electron transporting emission layer, and $Li_2O$ was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 38.8 $mA/cm^2$, and the luminance was at 620 $cd/m^2$. The non-emission luminance under an irradiation of $300 1_x$ was found to be 2.46 $cd/m^2$, with a contrast being at 250:1.

EXAMPLE 4

ITO (with a film thickness of about 150 nm) and NiO (with a film thickness of about 70 nm) were, respectively, deposited, as an anode, on a 30 mm×30 mm glass substrate by RF sputtering. The light transmittance of this anode was found to be 40% at 520 nm, with its work function being 5.47 eV. A cell for making an organic electroluminescent device, in which an area other than a 2 mm×2 mm emission region was masked through deposition of $SiO_2$, was formed on this built-up body. Next, α-NPD (α-naphthylphenyldiamine) was deposited, as a hole transport layer, in a thickness of 50 nm (at a deposition rate of 0.2 nm/second) under vacuum according to a vacuum deposition technique. $Alq_3$ (8-hydroxyquinoline aluminum) was subsequently deposited in a thickness of 50 nm as an electron transporting emission layer, and $Li_2O$ was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 41.0 $mA/cm^2$, and the luminance was at 800 $cd/m^2$. The non-emission luminance under an irradiation of $300 1_x$ was found to be 2.49 $cd/m^2$, with a contrast being at 320:1.

EXAMPLE 5

ITO (with a film thickness of about 150 nm) and NiO (with a film thickness of about 60 nm) were, respectively, deposited, as an anode, on a 30 mm×30 mm glass substrate by RF sputtering. The light transmittance of this anode was found to be 43% at 520 nm, with its work function being 5.45 eV. A cell for making an organic electroluminescent device, in which an area other than a 2 mm×2 mm emission region was masked through deposition of $SiO_2$, was formed on this built-up body. Next, α-NPD (α-naphthylphenyldiamine) was deposited, as a hole transport layer, in a thickness of 50 nm (at a deposition rate of 0.2 nm/second) under vacuum according to a vacuum deposition technique.

Alq$_3$ (8-hydroxyquinoline aluminum) was subsequently deposited in a thickness of 50 nm as an electron transporting emission layer, and Li$_2$O was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 41.5 mA/cm$^2$, and the luminance was at 880 cd/m$^2$. The non-emission luminance under an irradiation of 300l$_x$ was found to be 2.50 cd/m$^2$, with a contrast being at 350:1.

EXAMPLE 6

ITO (with a film thickness of about 150 nm) and NiO (with a film thickness of about 55 nm) were, respectively, deposited, as an anode, on a 30 mm×30 mm glass substrate by RF sputtering. The light transmittance of this anode was found to be 46% at 520 nm, with its work function being 5.40 eV. A cell for making an organic electroluminescent device, in which an area other than a 2 mm×2 mm emission region was masked through deposition of SiO$_2$, was formed on this built-up body. Next, α-NPD (α-naphthylphenyl-diamine) was deposited, as a hole transport layer, in a thickness of 50 nm (at a deposition rate of 0.2 nm/second) under vacuum according to a vacuum deposition technique. Alq$_3$ (8-hydroxyquinoline aluminum) was subsequently deposited in a thickness of 50 nm as an electron transporting emission layer, and Li$_2$O was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 42.1 mA/cm$^2$, and the luminance was at 970 cd/m$^2$. The non-emission luminance under an irradiation of 300l$_x$ was found to be 2.55 cd/m$^2$, with a contrast being at 380:1.

EXAMPLE 7

ITO (with a film thickness of about 150 nm) and NiO (with a film thickness of about 40 nm) were, respectively, deposited, as an anode, on a 30 mm×30 mm glass substrate by RF sputtering. The light transmittance of this anode was found to be 50% at 520 nm, with its work function being 5.38 eV. A cell for making an organic electroluminescent device, in which an area other than a 2 mm×2 mm emission region was masked through deposition of SiO$_2$, was formed on this built-up body. Next, α-NPD (α-naphthylphenyl-diamine) was deposited, as a hole transport layer, in a thickness of 50 nm (at a deposition rate of 0.2 nm/second) under vacuum according to a vacuum deposition technique. Alq$_3$ (8-hydroxyquinoline aluminum) was subsequently deposited in a thickness of 50 nm as an electron transporting emission layer, and Li$_2$O was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 41.6 mA/cm$^2$, and the luminance was at 1030 cd/m$^2$. The non-emission luminance under an irradiation of 300l$_x$ was found to be 2.59 cd/m$^2$, with a contrast being at 400:1.

EXAMPLE 8

ITO (with a film thickness of about 150 nm) and NiO (with a film thickness of about 30 nm) were, respectively, deposited, as an anode, on a 30 mm×30 mm glass substrate by RF sputtering. The light transmittance of this anode was found to be 58% at 520 nm, with its work function being 5.32 eV. A cell for making an organic electroluminescent device, in which an area other than a 2 mm×2 mm emission region was masked through deposition of SiO$_2$, was formed on this built-up body. Next, α-NPD (α-naphthylphenyl-diamine) was deposited, as a hole transport layer, in a thickness of 50 nm (at a deposition rate of 0.2 nm/second) under vacuum according to a vacuum deposition technique. Alq$_3$ (8-hydroxyquinoline aluminum) was subsequently deposited in a thickness of 50 nm as an electron transporting emission layer, and Li$_2$O was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 40.0 mA/cm$^2$, and the luminance was at 1110 cd/m$^2$. The non-emission luminance under an irradiation of 300l$_x$ was found to be 2.68 cd/m$^2$, with a contrast being at 420:1.

EXAMPLE 9

ITO (with a film thickness of about 150 nm) and NiO (with a film thickness of about 22 nm) were, respectively, deposited, as an anode, on a 30 mm×30 mm glass substrate by RF sputtering. The light transmittance of this anode was found to be 63% at 520 nm, with its work function being 5.31 eV. A cell for making an organic electroluminescent device, in which an area other than a 2 mm×2 mm emission region was masked through deposition of SiO$_2$, was formed on this built-up body. Next, α-NPD (α-naphthylphenyl-diamine) was deposited, as a hole transport layer, in a thickness of 50 nm (at a deposition rate of 0.2 nm/second) under vacuum according to a vacuum deposition technique. Alq$_3$ (8-hydroxyquinoline aluminum) was subsequently deposited in a thickness of 50 nm as an electron transporting emission layer, and Li$_2$O was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 39.6 mA/cm$^2$, and the luminance was at 1200 cd/m². The non-emission luminance under an irradiation of 300$l_x$ was found to be 2.92 cd/m², with a contrast being at 410:1.

EXAMPLE 10

ITO (with a film thickness of about 150 nm) and NiO (with a film thickness of about 18 nm) were, respectively, deposited, as an anode, on a 30 mm×30 mm glass substrate by RF sputtering. The light transmittance of this anode was found to be 70% at 520 nm, with its work function being 5.27 eV. A cell for making an organic electroluminescent device, in which an area other than a 2 mm×2 mm emission region was masked through deposition of $SiO_2$, was formed on this built-up body. Next, α-NPD (α-naphthylphenyldiamine) was deposited, as a hole transport layer, in a thickness of 50 nm (at a deposition rate of 0.2 nm/second) under vacuum according to a vacuum deposition technique. $Alq_3$ (8-hydroxyquinoline aluminum) was subsequently deposited in a thickness of 50 nm as an electron transporting emission layer, and $Li_2O$ was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 37.2 mA/cm², and the luminance was at 1050 cd/m². The non-emission luminance under an irradiation of 300$l_x$ was found to be 3.10 cd/m², with a contrast being at 340:1.

EXAMPLE 11

ITO (with a film thickness of about 150 nm) and NiO (with a film thickness of about 15 nm) were, respectively, deposited, as an anode, on a 30 mm×30 mm glass substrate by RF sputtering. The light transmittance of this anode was found to be 75% at 520 nm, with its work function being 5.27 eV. A cell for making an organic electroluminescent device, in which an area other than a 2 mm×2 mm emission region was masked through deposition of $SiO_2$, was formed on this built-up body. Next, α-NPD (α-naphthylphenyldiamine) was deposited, as a hole transport layer, in a thickness of 50 nm (at a deposition rate of 0.2 nm/second) under vacuum according to a vacuum deposition technique. $Alq_3$ (8-hydroxyquinoline aluminum) was subsequently deposited in a thickness of 50 nm as an electron transporting emission layer, and $Li_2O$ was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 34.8 mA/cm², and the luminance was at 980 cd/m². The non-emission luminance under an irradiation of 300$l_x$ was found to be 3.49 cd/m², with a contrast being at 290:1.

EXAMPLE 12

ITO (with a film thickness of about 150 nm) and NiO (with a film thickness of about 10 nm) were, respectively, deposited, as an anode, on a 30 mm×30 mm glass substrate by RF sputtering. The light transmittance of this anode was found to be 80% at 520 nm, with its work function being 5.10 eV. A cell for making an organic electroluminescent device, in which an area other than a 2 mm×2 mm emission region was masked through deposition of $SiO_2$, was formed on this built-up body. Next, α-NPD (α-naphthylphenyldiamine) was deposited, as a hole transport layer, in a thickness of 50 nm (at a deposition rate of 0.2 nm/second) under vacuum according to a vacuum deposition technique. $Alq_3$ (8-hydroxyquinoline aluminum) was subsequently deposited in a thickness of 50 nm as an electron transporting emission layer, and $Li_2O$ was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 32.2 mA/cm², and the luminance was at 880 cd/m². The non-emission luminance under an irradiation of 300$l_x$ was found to be 3.78 cd/m², with a contrast being at 230:1.

EXAMPLE 13

ITO (with a film thickness of about 150 nm) was deposited, as an anode, on a 30 mm×30 mm glass substrate by RF sputtering. The light transmittance of this anode was found to be 90% at 520 nm, with its work function being 4.80 eV. A cell for making an organic electroluminescent device, in which an area other than a 2 mm×2 mm emission region was masked through deposition of $SiO_2$, was formed on this built-up body. Next, α-NPD (α-naphthylphenyldiamine) was deposited, as a hole transport layer, in a thickness of 50 nm (at a deposition rate of 0.2 nm/second) under vacuum according to a vacuum deposition technique. $Alq_3$ (8-hydroxyquinoline aluminum) was subsequently deposited in a thickness of 50 nm as an electron transporting emission layer, and $Li_2O$ was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 21.9 mA/cm², and the luminance was at 556 cd/m². The non-emission luminance under an irradiation of 300$l_x$ was found to be 3.92 cd/m², with a contrast being at 140:1.

Figure 6:
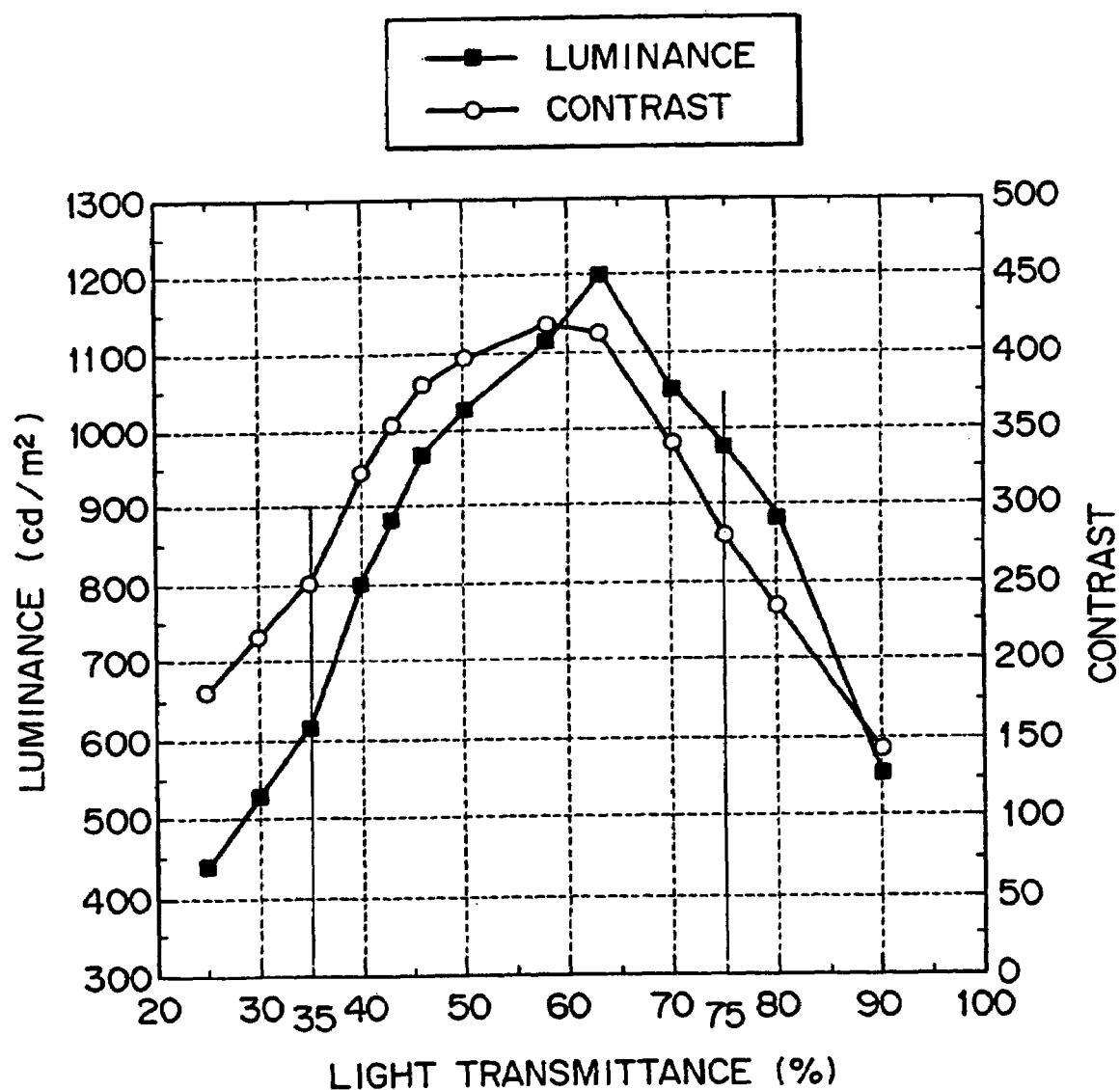
FIG. 6 is a graph showing luminance and contrast in relation to the variation in light transmittance of an anode of a light-emitting device.

The contrast and luminance of the devices of Examples 1 to 12 and Example 13 driven at 6 V in relation to the light transmittance of the anodes of the devices (wavelength: 520 nm) are shown in FIG. 6. As will be apparent from this figure, when the light transmittance of the anode ranges from 35% to 75%, a contrast of 250:1 or over is achieved. Further, when the light transmittance of the anode is in the range of not smaller than 40% and not larger than 70%, a contrast of 300:1 or over is achieved. Moreover, when the light transmittance of the anode is in the range of not smaller than 50% and not larger than 70%, both a contrast of 300:1 or over and a luminance of 1000 cd/m² or over can be attained.

EXAMPLE 14

ITO (with a film thickness of about 150 nm) and NiO:Li (with a Li concentration of about 1 molt and a film thickness of about 25 nm) were, respectively, deposited, as an anode, on a 30 mm×30 mm glass substrate by RF sputtering. The light transmittance of this anode was found to be 60% at 520 nm, with its work function being 5.32 eV. A cell for making an organic electroluminescent device, in which an area other than a 2 mm×2 mm emission region was masked through deposition of $SiO_2$, was formed on this built-up body. Next, α-NPD (α-naphthylphenyldiamine) was deposited, as a hole transport layer, in a thickness of 50 nm (at a deposition rate of 0.2 nm/second) under vacuum according to a vacuum deposition technique. $Alq_3$ (8-hydroxyquinoline aluminum) was subsequently deposited in a thickness of 50 nm as an electron transporting emission layer, and LiF was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 63.6 mA/cm², and the luminance was at 2720 cd/m². The non-emission luminance under an irradiation of $300 1_x$ was found to be 2.86 cd/m², with a contrast being at 950:1.

EXAMPLE 15

ITO (with a film thickness of about 150 nm) and $LiNiO_2$ (with a film thickness of about 25 nm) were, respectively, deposited, as an anode, on a 30 mm×30 mm glass substrate by RF sputtering. The light transmittance of this anode was found to be 60% at 520 nm, with its work function being 5.32 eV. A cell for making an organic electroluminescent device, in which an area other than a 2 mm×2 mm emission region was masked through deposition of $SiO_2$, was formed on this built-up body. Next, α-NPD (α-naphthylphenyldiamine) was deposited, as a hole transport layer, in a thickness of 50 nm (at a deposition rate of 0.2 nm/second) under vacuum according to a vacuum deposition technique. $Alq_3$ (8-hydroxyquinoline aluminum) was subsequently deposited in a thickness of 50 nm as an electron transporting emission layer, and LiF was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 119 mA/cm², and the luminance was at 3110 cd/m². The non-emission luminance under an irradiation of $300 1_x$ was found to be 2.95 cd/m², with a contrast being at 1050:1.

EXAMPLE 16

ITO (with a film thickness of about 150 nm) was deposited, as an anode, on a 30 mm×30 mm glass substrate by RF sputtering. The light transmittance of this anode was found to be 90% at 520 nm, with its work function being 4.8 eV. A cell for making an organic electroluminescent device, in which an area other than a 2 mm×2 mm emission region was masked through deposition of $SiO_2$, was formed on this built-up body. Next, α-NPD (α-naphthylphenyldiamine) was deposited, as a hole transport layer, in a thickness of 50 nm (at a deposition rate of 0.2 nm/second) under vacuum according to a vacuum deposition technique. $Alq_3$ (8-hydroxyquinoline aluminum) was subsequently deposited in a thickness of 50 nm as an electron transporting emission layer, and LiF was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 58.2 mA/cm², and the luminance was at 2210 cd/m². The non-emission luminance under an irradiation of $300 1_x$ was found to be 3.95 cd/m², with a contrast being at 560:1.

EXAMPLE 17

There were, respectively, deposited on a 30 mm×30 mm glass substrate, Al—Li (with a Li concentration of about 1 mol %) as a cathode in a thickness of about 200 nm, $Alq_3$ (8-hydroxyquinoline aluminum) as an electron transporting emission layer in a thickness of 50 nm, and α-NPD (α-naphthylphenyldiamine) as a hole transport layer in a thickness of 50 nm, each according to a vacuum deposition technique. Next, an area other than a 2 mm×2 mm emission region was masked with $SiO_2$ by a vacuum deposition technique. $RuO_2$ (with a film thickness of about 6 nm) was subsequently formed as an anode in the form of a film by RF sputtering to make an organic electroluminescent device. The light transmittance of this anode was found to be 58% at 520 nm, with its work function being 5.18 eV.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 34.4 mA/cm², and the luminance was at 780 cd/m². The non-emission luminance under an irradiation of $300 1_x$ was found to be 2.45 cd/m², with a contrast being at 320:1.

EXAMPLE 18

There were, respectively, deposited on a 30 mm×30 mm glass substrate, Al—Li (with a Li concentration of about 1 mol %) as a cathode in a thickness of about 200 nm, $Alq_3$ (8-hydroxyquinoline aluminum) as an electron transporting emission layer in a thickness of 50 nm, and α-NPD (α-naphthylphenyldiamine) as a hole transport layer in a thickness of 50 nm, each according to a vacuum deposition technique. Next, an area other than a 2 mm×2 mm emission region was masked with $SiO_2$ by a vacuum deposition technique. ITO (with a film thickness of about 150 nm) was subsequently formed as an anode in the form of a film by RF sputtering to make an organic electroluminescent device. The light transmittance of this anode was found to be 90% at 520 nm, with its work function being 4.8 eV.

The characteristic measurements of the organic electroluminescent device revealed that a maximum emission wavelength was at 520 nm, with coordinates of (0.32, 0.55) on the CIE chromaticity coordinates, thereby permitting good green emission. The current density at a drive voltage of 6 V was found to be 20.5 mA/cm$^2$, and the luminance was at 520 cd/m$^2$. The non-emission luminance under an irradiation of $300 1_x$ was found to be 3.5.1 cd/m$^2$, with a contrast being at 150:1.

EXAMPLE 19

ITO (with a film thickness of about 150 nm) and NiO:Li (with a Li concentration of about 1 mol % and a film thickness of about 20 nm) were, respectively, deposited, as an anode, on a 30 mm×30 mm glass substrate by RF sputtering. The light transmittance of this anode was found to be 68% at 520 nm, with its work function being 5.29 eV. A cell for making an organic electroluminescent device, in which an area other than a 2 mm×2 mm emission region was masked through deposition of SiO$_2$, was formed on this built-up body. Next, m-MTDATA (4,4',4"-tris[[N-(3-methylphenylphenylamino)triphenylamine] was deposited, as a hole injection layer, in a thickness of 25 nm (at a deposition rate of 0.2 nm/second) under vacuum according to a vacuum deposition technique, and α-NPD (α-naphthylphenyldiamine) was deposited, as a hole transport layer in a thickness of 50 nm (at a deposition rate of 0.2 nm/second). Alq$_3$ (8-hydroxyquinoline aluminum) was subsequently deposited in a thickness of 50 nm as an electron transporting emission layer, and Li$_2$O was deposited as a buffer layer in a thickness of 0.5 nm. Al was further deposited as a cathode in a thickness of about 200 nm, thereby making an organic electroluminescent device.

The characteristic measurements of the organic electroluminescent device revealed that a maximum emission wavelength was at 520 nm, with coordinates of (0.34, 0.56) on the CIE chromaticity coordinates, thereby permitting good green emission. The current density at a drive voltage of 10 V was found to be 14.6 mA/cm$^2$, and the luminance was at 710 cd/m$^2$. The non-emission luminance under an irradiation of $300 1_x$ was found to be 2.82 cd/m$^2$, with a contrast being at 250:1.

EXAMPLE 20

ITO (with a film thickness of about 150 nm) was deposited, as an anode, on a 30 mm×30 mm glass substrate by RF sputtering. The light transmittance of this anode was found to be 90% at 520 nm, with its work function being 4.8 eV. A cell for making an organic electroluminescent device, in which an area other than a 2 mm×2 mm emission region was masked through deposition of SiO$_2$, was formed on this built-up body. Next, there was deposited, under vacuum according to a vacuum deposition technique, m-MTDATA (4,4',4"-tris[[N-(3-methylphenylphenylamino)triphenylamine] as a hole injection layer in a thickness of 25 nm (at a deposition rate of 0.2 nm/second). Subsequently, there were, respectively, deposited, α-NPD (α-naphthylphenyldiamine) as a hole transport layer in a thickness of 50 nm (at a deposition rate of 0.2 nm/second), Alq$_3$ (8-hydroxyquinoline aluminum) as an electron transporting emission layer in a thickness of 50 nm, Li$_2$O as a buffer layer in a thickness of 0.5 nm, and Al as a cathode in a thickness of about 200 nm, thereby making an organic electroluminescent device.

The characteristic measurements of the organic electroluminescent device revealed that a maximum emission wavelength was at 520 nm, with coordinates of (0.34, 0.56) on the CIE chromaticity coordinates, thereby permitting good green emission. The current density at a drive voltage of 10 V was found to be 11.0 mA/cm$^2$, and the luminance was at 498 cd/m$^2$. The non-emission luminance under an irradiation of $300 1_x$ was found to be 3.84 cd/m$^2$, with a contrast being at 130:1.

EXAMPLE 21

ITO (with a film thickness of about 150 nm) and LiNiO$_2$ (with a film thickness of about 40 nm) were, respectively, deposited, as an anode, on a 30 mm×30 mm glass substrate by RF sputtering. The light transmittance of this anode was found to be 48% at 520 nm, with its work function being 5.40 eV. An ITO substrate for making a light-emitting device, in which an area other than a 2 mm×2 mm emission region was masked through deposition of SiO$_2$, was formed on this built-up body. An inorganic electroluminescent device made of CaCa$_2$S$_4$:Ce as a fluorescent body at the emission center was formed on the substrate. When the device was driven under conditions of 5 V and 60 Hz, the maximum luminance was 15 cd/m$^2$. The non-emission luminance under an irradiation of $300 1_x$ was found to be 2.55 cd/m$^2$, with a contrast being at 6:1.

EXAMPLE 22

ITO (with a film thickness of about 150 nm) was deposited, as an anode, on a 30 mm×30 mm glass substrate by RF sputtering. The light transmittance of this anode was found to be 90% at 520 nm, with its work function being 4.8 eV. An ITO substrate for making a light-emitting device, in which an area other than a 2 mm×2 mm emission region was masked through deposition of SiO$_2$, was formed on this built-up body. An inorganic electroluminescent device made of CaCa$_2$S$_4$:Ce as a fluorescent body at the emission center was formed on the substrate. When the device was driven under conditions of 5 V and 60 Hz, the maximum luminance was 8 cd/m$^2$. The non-emission luminance under an irradiation of $300 1_x$ was found to be 3.92 cd/m$^2$, with a contrast being at 2:1. The comparison of this inorganic electroluminescent device with that of Example 21 revealed that this device is lower in the luminance and contrast. Thus, it will be apparent that the emission of the latter device is more efficient.

The results of the visible light (wavelength of 520 nm) transmittance, work function and contrast of the anodes obtained in Examples 1 to 22 are shown in Table 1.

Figure 7:
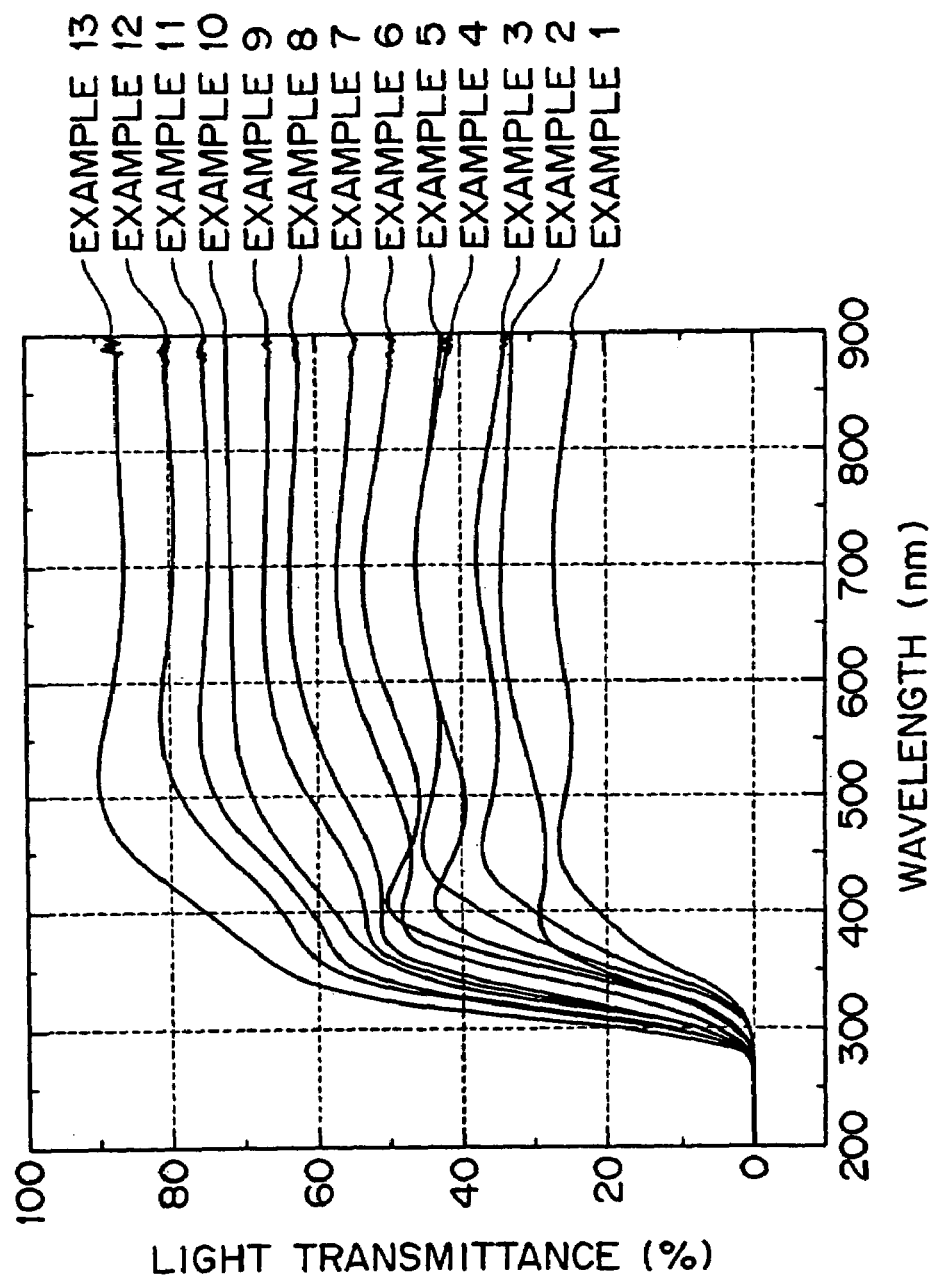
FIG. 7 is a graph showing light transmission spectra of light-emitting devices of examples.
Figure 8:
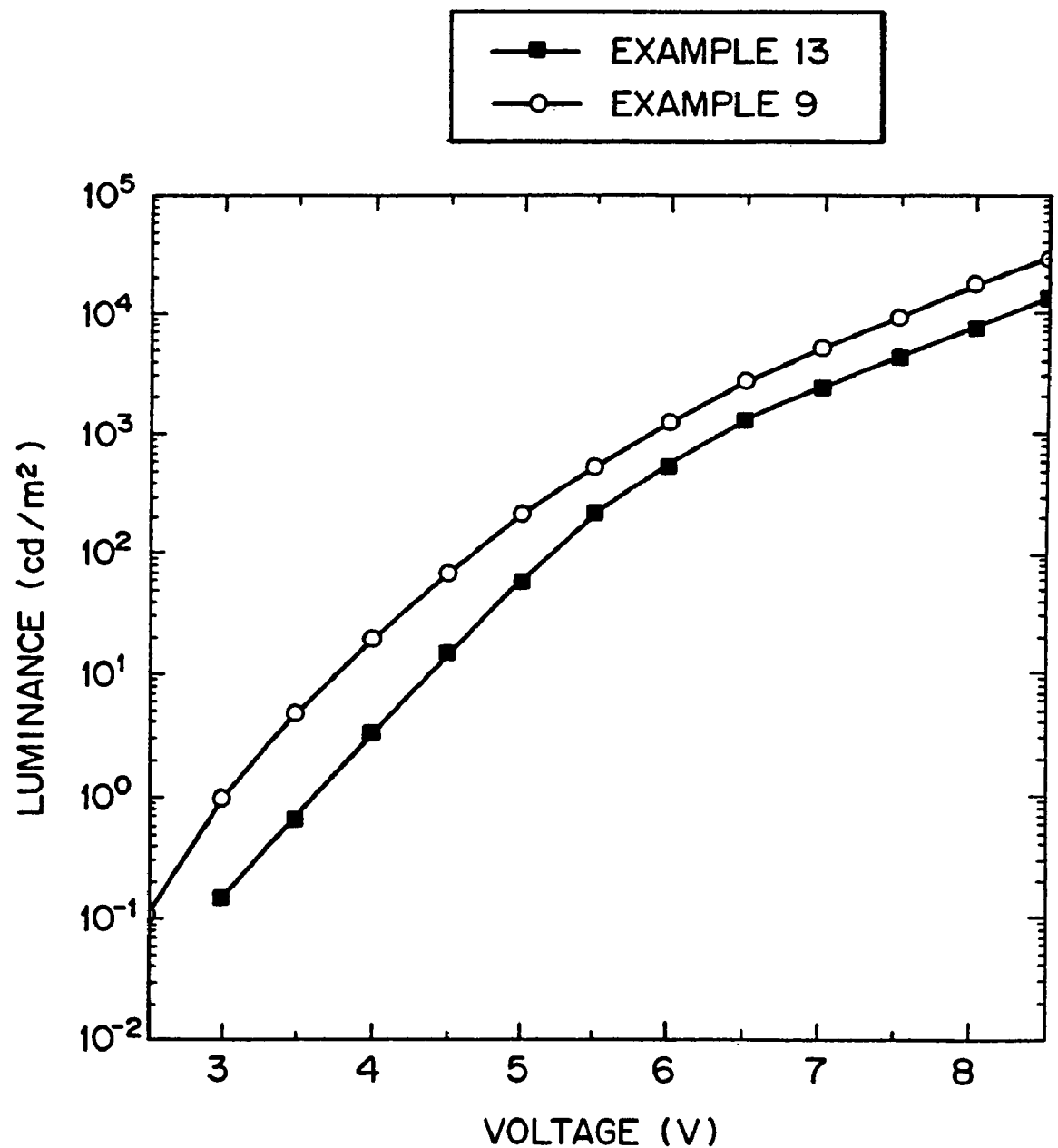
FIG. 8 is a graph showing a voltage-luminance characteristic of light-emitting devices of examples under DC drive conditions.

The luminance and contrast in relation to the light transmittance (at 520 nm) obtained in Examples 1 to 13 are shown in FIG. 6. The transmission spectra obtained in Examples 1 to 13 are shown in FIG. 7. The relation of voltage-luminance characteristics under DC drive in Examples 9 and 13 is shown in FIG. 8.

TABLE 1

|  | Visible Light Transmittance of Anode (%) | Work Function (eV) | Contrast (Lightness/Darkness) |
|---|---|---|---|
| Example 1 | 25 | 5.51 | 180:1 |
| Example 2 | 30 | 5.52 | 220:1 |
| Example 3 | 35 | 5.50 | 250:1 |
| Example 4 | 40 | 5.47 | 320:1 |
| Example 5 | 43 | 5.45 | 350:1 |
| Example 6 | 46 | 5.40 | 380:1 |
| Example 7 | 50 | 5.38 | 400:1 |
| Example 8 | 58 | 5.32 | 420:1 |
| Example 9 | 63 | 5.31 | 410:1 |
| Example 10 | 70 | 5.27 | 340:1 |
| Example 11 | 75 | 5.27 | 290:1 |
| Example 12 | 80 | 5.10 | 230:1 |
| Example 13 | 90 | 4.80 | 140:1 |
| Example 14 | 60 | 5.32 | 950:1 |
| Example 15 | 60 | 5.32 | 1050:1 |
| Example 16 | 90 | 4.80 | 560:1 |
| Example 17 | 58 | 5.18 | 320:1 |
| Example 18 | 90 | 4.80 | 150:1 |
| Example 19 | 68 | 5.29 | 250:1 |
| Example 20 | 90 | 4.80 | 130:1 |
| Example 21 | 48 | 5.40 | 6:1 |
| Example 22 | 90 | 4.80 | 2:1 |

As stated hereinabove, the light-emitting devices of the invention (Examples 3 to 11, 14, 15, 17, 19 and 21) are so defined that the anode has a light transmittance of 35 to 75%, under which the contrast can be reliably improved while keeping a high luminance. Moreover, when the work function of the anode is defined within a range of 3.0 to 7.0 eV, the hole injection efficiency of the light-emitting device is improved. This not only leads to an improved luminous efficiency, but also permits a wide choice of materials of an anode and a hole injection layer and the use of various types of materials by optimizing the energy matching between the hole injection layer and the anode.

Since the light transmittance of the anode is defined within a range of 35 to 75%, the light-emitting device including not only an organic electroluminescent device, but also an inorganic electroluminescent device is reliably improved in contrast while keeping a high luminance.

What is claimed is:

1. An electronic device comprising:
a light-emitting device comprising:
  an anode;
  a cathode;
  a hole injection layer between said anode and said cathode; and
  a layer including an emission region and provided between the anode and the cathode,
wherein,
  said anode a visible light transmittance of 35 to 75%,
  said anode includes a metal selected from the group consisting of Ni, Ru, Ir, Rh, Pt, Pd, Re, Zr, Nb, Mo, and W, and
  said anode comprises a first layer comprising a first compound selected from the group consisting of zinc, indium, and tin and a second layer comprising said metal, and
  the electronic device is one of a camcorder or a camera.

2. An electronic device according to claim 1, wherein the visible light has a wavelength ranging from 380 nm to 780 nm.

3. An electronic device according to claim 1, wherein said anode comprises a first layer comprising a first compound selected from the group consisting of zinc, indium, and tin and a second layer comprising said metal.

4. An electronic device according to claim 1, wherein said second layer further comprises a metal compound having said metal and a material selected form the group consisting of oxides, nitrides and oxide-nitrides.

5. An electronic device according to claim 1, wherein said anode has a work function of 3.0 to 7.0 eV.

6. An electronic device according to claim 1, wherein said device comprises, on a transparent substrate, a built-up body including said anode, an organic layer containing said emission region and said cathode.

7. An electronic device according to claim 6, wherein said organic layer includes a hole transport layer at a side of said anode and an electron transport layer at a side of said cathode.

8. An electronic device according to claim 7, wherein said hole injection layer is provided between said anode and said hole transport layer.

9. An electronic device according to claim 7, wherein said organic layer has an emission layer between said hole transport layer and said electron transport layer.

10. An electronic device according to claim 1, where said anode has a dopant selected from the group consisting of H, Li, Na, K, Rb, Cs, Cu, Ag, and Au.

11. An electronic device according to claim 1, where said second layer has a thickness in the range of 15 nm to 80 nm.

12. An electronic device according to claim 11, where said light-emitting device has a luminance that increases within the range of 620 to 1200 cd/m2 as said thickness of said second layer is decreased within the range of 15 nm to 80 nm and has a contrast corresponding to said luminance that increases within the range of 250:1 to 410:1 as said thickness of said second layer is decreased within the range of 15 nm to 80 nm.

* * * * *

UNITED STATES PATENT AND TRADEMARK OFFICE
CERTIFICATE OF CORRECTION

PATENT NO. : 7,208,868 B2
APPLICATION NO. : 10/779005
DATED : April 24, 2007
INVENTOR(S) : Naoyuki Ueda et al.

It is certified that error appears in the above-identified patent and that said Letters Patent is hereby corrected as shown below:

The title page item [75] inventor's name "Yasunori Kuima" should read --Yasunori Kijima --

Signed and Sealed this

Nineteenth Day of June, 2007

JON W. DUDAS
*Director of the United States Patent and Trademark Office*